United States Patent [19]
Otsuka et al.

[11] Patent Number: 5,818,302
[45] Date of Patent: Oct. 6, 1998

[54] AUTOMATIC FREQUENCY CONTROL OSCILLATION CIRCUIT

[75] Inventors: Shigeru Otsuka, Tokyo; Kanada Nakayasu, Saitama, both of Japan

[73] Assignee: NEC Corporation, Tokyo, Japan

[21] Appl. No.: 795,566

[22] Filed: Feb. 6, 1997

[30] Foreign Application Priority Data

Feb. 6, 1996 [JP] Japan ..................... 8-019809

[51] Int. Cl.⁶ ........................................ H03L 7/00
[52] U.S. Cl. ..................... 331/17; 331/25; 331/51; 327/147
[58] Field of Search ................. 331/17, 15, 25, 331/51; 327/147

[56] References Cited

U.S. PATENT DOCUMENTS

| | | | |
|---|---|---|---|
| 4,884,040 | 11/1989 | Fling | 331/17 X |
| 5,475,718 | 12/1995 | Rosenkranz | 327/147 X |
| 5,648,964 | 7/1997 | Inagaki et al. | 375/357 |

FOREIGN PATENT DOCUMENTS 62-7728  2/1987  Japan .

*Primary Examiner*—Haun Hoang
*Attorney, Agent, or Firm*—Sughrue, Mion, Zinn, Macpeak & Seas, PLLC

[57] ABSTRACT

A voltage-controlled oscillator generates an oscillation signal having a frequency corresponding to a control signal. A phase comparator detects a phase difference between a reference signal and a frequency-divided signal derived from the oscillation signal and generates a phase difference signal. A control circuit, which comprises an A/D converter, a high-speed processor, and a D/A converter, generates a control voltage so as to reduce a time-dependent change in the phase difference signal to synchronize the oscillation signal with the reference signal. When the synchronization of the oscillation signal with the reference signal is completed, the control circuit secures a control voltage at the time time-dependent change in the phase difference signal becomes equal to or smaller than a phase difference stored in a flash ROM.

9 Claims, 3 Drawing Sheets

$V_d$ c01

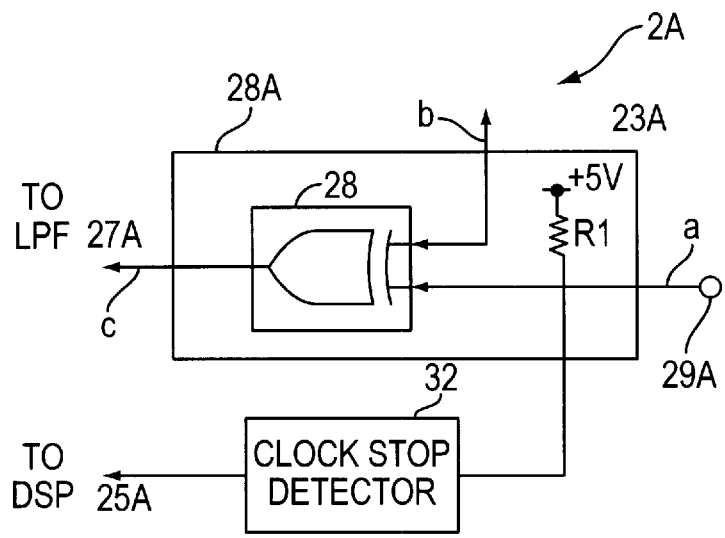
FIG. 4
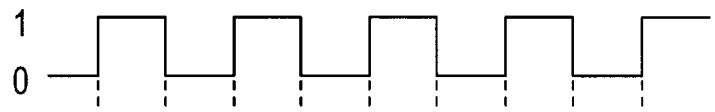
FIG. 5a $b_0$
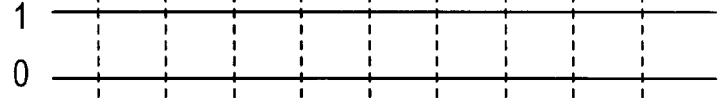
FIG. 5b $a_{o2}$
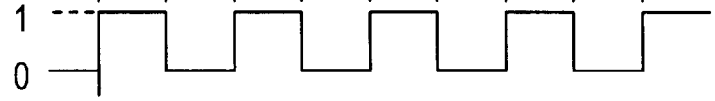
FIG. 5c $c_{o2}$
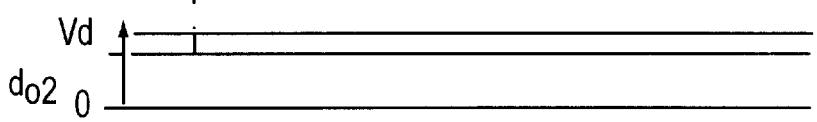
FIG. 5d $d_{o2}$ 5,818,302

1

AUTOMATIC FREQUENCY CONTROL OSCILLATION CIRCUIT

BACKGROUND OF THE INVENTION

1. Field of the Invention

The present invention relates to an automatic frequency control (AFC) oscillation circuit having a frequency control circuit for correcting the frequency of an output signal, and more particularly to an AFC oscillation circuit having a phase-locked loop (PLL) for frequency control.

2. Description of the Related Art

Radio receivers which are required to change accurately and stably the frequency of a local oscillation signal often employ a PLL synthesizer which uses an output signal from a voltage-controlled oscillator (VCO) as a local oscillation signal.

FIG. 1 of the accompanying drawings shows in block form a conventional AFC local oscillator for use in a frequency modulation (FM) receiver. FIG. 1 illustrates a major portion of a circuit disclosed in Japanese patent publication No. 62-7728 (1987). The illustrated AFC local oscillator includes a combination of a PLL synthesizer and an S-curve follow-up oscillator. The names of parts and reference characters shown in FIG. 1 differ from those which are employed in the publication.

In FIG. 1, an FM reception circuit 5 constitutes part of a general FM receiver. A signal received by an antenna 51 of the FM reception circuit 5 is amplified by an amplifier 52, and then converted into an intermediate-frequency signal by a mixer (MIX) 53 using a local oscillation signal f1 supplied from a VCO 61. The intermediate-frequency signal is then amplified by an intermediate-frequency amplifier 54. A detector 55 detects an FM signal from the amplified intermediate-frequency signal, and delivers the detected FM signal to a subsequent stage.

The AFC local oscillator includes a PLL circuit 7 which is a synthesizer local oscillator having a PLL. Specifically, the PLL circuit 7 includes a VCO 61 for generating a local oscillation signal f1 and a frequency divider (DIV) 62 for frequency-dividing the local oscillation signal f1 into a predetermined frequency signal. The PLL circuit 7 also has a programmable frequency divider (PRO-DIV) 71 for frequency-dividing an output signal from the frequency divider 62 into a frequency-divided signal fp at a frequency division ratio that is controlled by a control circuit 74. A phase comparator 72 compares the phase of a reference signal of outputted from a reference oscillator 76 which comprises a quartz oscillator and the phase of the frequency-divided signal fp outputted from the programmable frequency divider 71. The frequency-divided signal fp is held in phase with the local oscillation signal f1. Depending on an output signal from the phase comparator 72, a charge pump 73 generates a three-valued digital signal which is indicative of either a first state of "H", a second state of "L", or a third stage of "HI impedance".

The AFC local oscillator includes an S-curve follow-up loop 6 which is an S-curve follow-up local oscillator for controlling the frequency of the local oscillation signal f1 produced by the VCO 61 according to an S-curve. The S-curve follow-up loop 6 supplies a control voltage to the VCO 61 depending on an S-curve signal outputted from the detector 55. The S-curve follow-up loop 6 includes an amplifier 64 for amplifying the output signal from the detector 55, a charge pump 67 for generating a three-valued level depending on an output signal from the amplifier 64,

2 a switch 66 having a fixed contact S connected to the charge pump 67, a fixed contact P connected to the charge pump 73, and a movable contact which can selectively be connected to the fixed contacts S, P, and a low-pass filter (LPF) 65 connected to the movable contact of the switch 66.

The switch 66 is controlled by the control circuit 74 to select either one of the PLL circuit 7 and the S-curve follow-up loop 6.

Operation of the AFC local oscillator shown in FIG. 1 will be described below.

When the AFC local oscillator starts to operate, the control circuit 74 connects the movable contact to the fixed contact P of the switch 66, selecting the PLL circuit 7 to generate the local oscillation signal f1. At this time, the phase comparator 72 compares the phase of the signal fp which has been frequency-divided by the frequency divider 62 and the programmable frequency divider 71 and the phase of the reference signal f0. If the frequency-divided signal fp is leading the reference signal f0, then a first output signal U from the phase comparator 72 is of an "L" level. If the frequency-divided signal fp is lagging the reference signal f0, then a second output signal D from the phase comparator 72 is of an "H" level. If the frequency-divided signal fp is in phase with the reference signal f0, then the first output signal U is of an "H" level and the second output signal D is of an "L" level.

Depending on the first and second output signals U, D from the phase comparator 72, the charge pump 73 generates a three-valued digital signal, which is then converted into an analog signal by the LPF 65. The DC voltage of the analog signal from the LPF 65 is supplied to the VCO 61. As a result, if the frequency-divided signal fp is leading the reference signal f0, then the frequency of the frequency-divided signal fp is lowered, and if the frequency-divided signal fp is lagging the reference signal f0, then the frequency of the frequency-divided signal fp is increased, bringing the frequency-divided signal fp based on the local oscillation signal f1 into synchronism with the reference signal f0.

When the local oscillation signal f1 is locked by the PLL circuit 7, the output level of the amplifier 54 is increased. The increased output level of the amplifier 54 is detected by a level detector (level DET) 63, indicating to the control circuit 74 that the field level of the intermediate-frequency signal has reached a predetermined level or higher. Based on the indicated level increase, the control circuit 74 recognizes that the FM reception circuit 5 is receiving a broadcast signal, and connects the movable contact to the fixed contact S of the switch 66 for thereby selecting the S-curve follow-up loop 6 to supply the local oscillation signal f1 to the mixer 53.

As described above, the AFC local oscillator switches between the PLL circuit 7 which is a PLL synthesizer local oscillator and the S-curve follow-up loop 6 which is an S-curve follow-up local oscillator, thereby to produce a local oscillation signal that is highly accurate and has excellent noise characteristics. Therefore, the AFC local oscillator is widely used in FM receivers which are of a narrow band and are required to reproduce low-noise FM signals.

Since the conventional AFC local oscillator effects its loop operation depending on the reference signal and the S-curve, however, even if it is initially locked to the reference signal and the S-curve, the local oscillation signal may subsequently fluctuate due to noise or loop fluctuations. Once the loop diverges due to noise, the AFC local oscillator may be locked to a frequency which is widely different from the desired frequency. Stated otherwise, the AFC local oscillator is relatively susceptible to noise interference.

The conventional AFC local oscillator needs to have a highly accurate and stable reference signal generator as the reference oscillator 76. The reference oscillator 76 is usually a highly accurate quartz oscillator which needs to be temperature-compensated. Consequently, the package of the AFC local oscillator is relatively large in volume. The AFC local oscillator cannot be reduced in size and weight, and is uneconomical.

SUMMARY OF THE INVENTION

It is therefore an object of the present invention to provide an automatic frequency control oscillation circuit which allows a radio receiver that incorporates the automatic frequency control oscillation circuit to be relatively small and simple in circuit arrangement, and which is capable of a highly accurate and stable local oscillation signal.

According to the present invention, there is provided an automatic frequency control oscillation circuit, comprising a voltage-controlled oscillator for producing an oscillation signal whose frequency is controlled by a control voltage, a phase comparator for detecting a phase difference between a frequency-divided signal derived from the oscillation signal produced by the voltage-controlled oscillator and a reference signal thereby to generate a phase difference signal, and a control circuit for generating a control voltage so as to reduce a time-dependent change in the phase difference signal to synchronize the oscillation signal produced by the voltage-controlled oscillator with the reference signal, the control circuit comprising means for monitoring and comparing a time-dependent change in the phase difference signal with a predetermined first phase difference, and means for securing a control voltage supplied to the voltage-controlled oscillator as a first control voltage when the time-dependent change in the phase difference signal is detected to be equal to or smaller than the first phase difference, i.e., the synchronization of the oscillation signal with the reference signal is completed.

The control circuit has a high-speed processor for monitoring a time-dependent change in the phase difference signal and establishing a control voltage as the first control voltage when the synchronization of the oscillation signal with the reference signal is completed. The control circuit also has an analog-to-digital converter for converting the phase difference signal from an analog form into a digital phase difference signal and supplying the digital phase difference signal to the high-speed processor, a flush read-only memory for storing a digital first control voltage generated by the high-speed processor and a predetermined phase difference in digital form, and a digital-to-analog converter for converting the digital control voltage read from the flush read-only memory into an analog control voltage and supplying the analog control voltage to the voltage-controlled oscillator.

The automatic frequency control oscillation circuit further has a reference signal stop detector for detecting a stop of supply of the reference signal. The flush read-only memory stores a predetermined second phase difference. When the reference signal stop detector detects a stop of supply of the reference signal after the first control voltage is established, the high-speed processor stores a phase difference signal upon detection of the stop of supply of the reference signal as a first phase difference signal into the flush read-only memory, determines the difference between the phase difference signal outputted from the analog-to-digital converter and the first phase difference signal stored in the flush read-only memory, and, if the determined difference is equal to or greater than the second phase difference, resumes a process of synchronizing the oscillation signal with the reference signal and updates the first control voltage stored in the flush read-only memory.

Once the frequency of the oscillation signal is synchronized, the control voltage is secured. Therefore, the automatic frequency control oscillation circuit can produce a highly accurate local oscillation frequency without a reference oscillator. The automatic frequency control oscillation circuit is not required to be supplied with the reference signal at all times, but an external reference oscillator may be connected to the automatic frequency control oscillation circuit when required. Because the automatic frequency control oscillation circuit needs no built-in reference oscillator, its circuit arrangement may be simplified.

The above and other objects, features, and advantages of the present invention will become apparent from the following description referring to the accompanying drawings which illustrate examples of the preferred embodiments of the present invention.

BRIEF DESCRIPTION OF THE DRAWINGS

FIG. 3 is a timing chart illustrative of operation of the AFC oscillation circuit according to the first embodiment of the present invention;

FIG. 4 is a block diagram of a phase comparator and a clock stop detector of an AFC oscillation circuit according to a second embodiment of the present invention; and FIG. 5 is a timing chart illustrative of operation of the AFC oscillation circuit according to the second embodiment of the present invention.

DETAILED DESCRIPTION OF THE PREFERRED EMBODIMENTS

Figure 1:
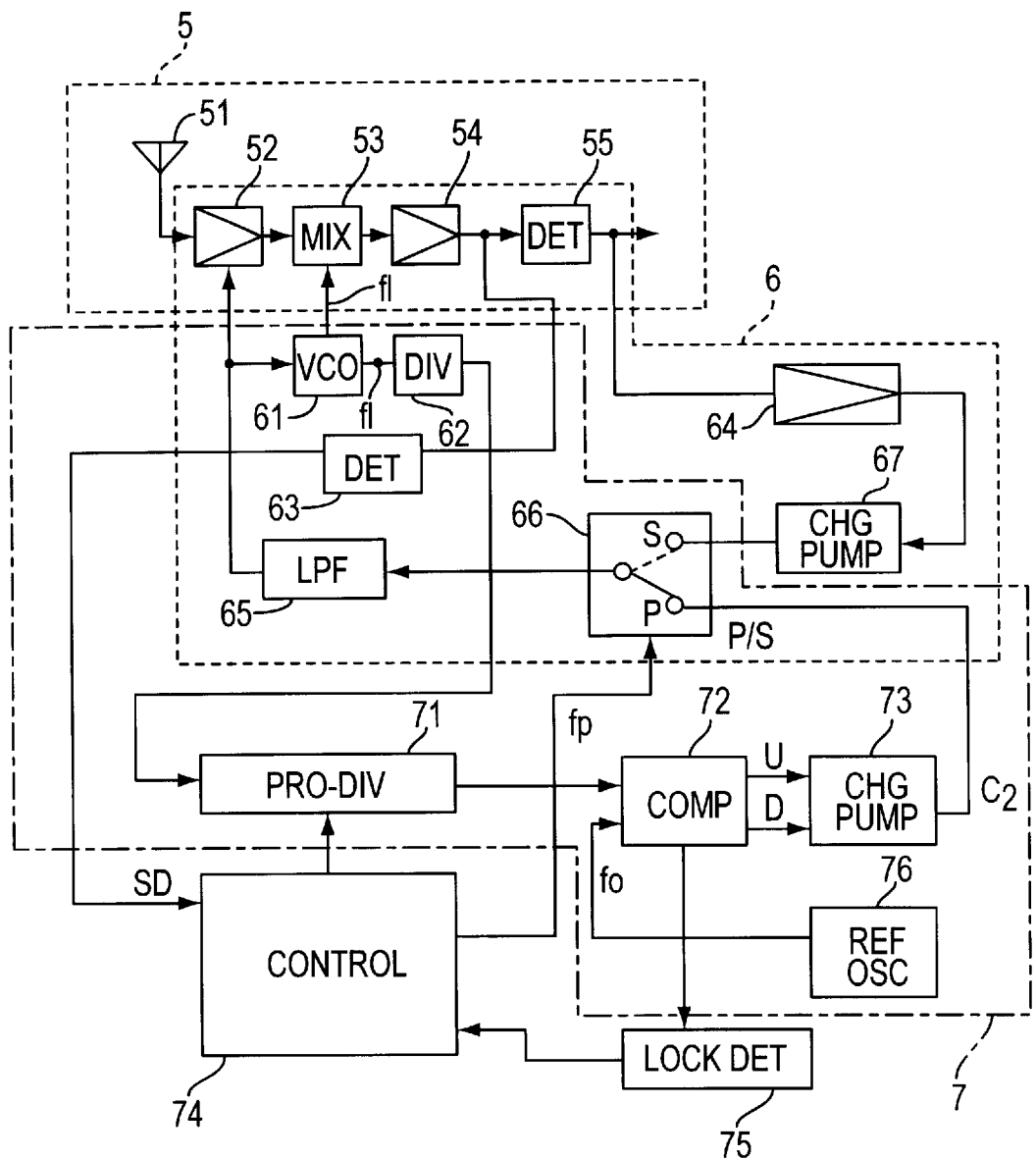
FIG. 1 is a block diagram of a radio receiver which incorporates a conventional AFC local oscillator.
Figures 2, 3A, 3B, 3C, 3D:
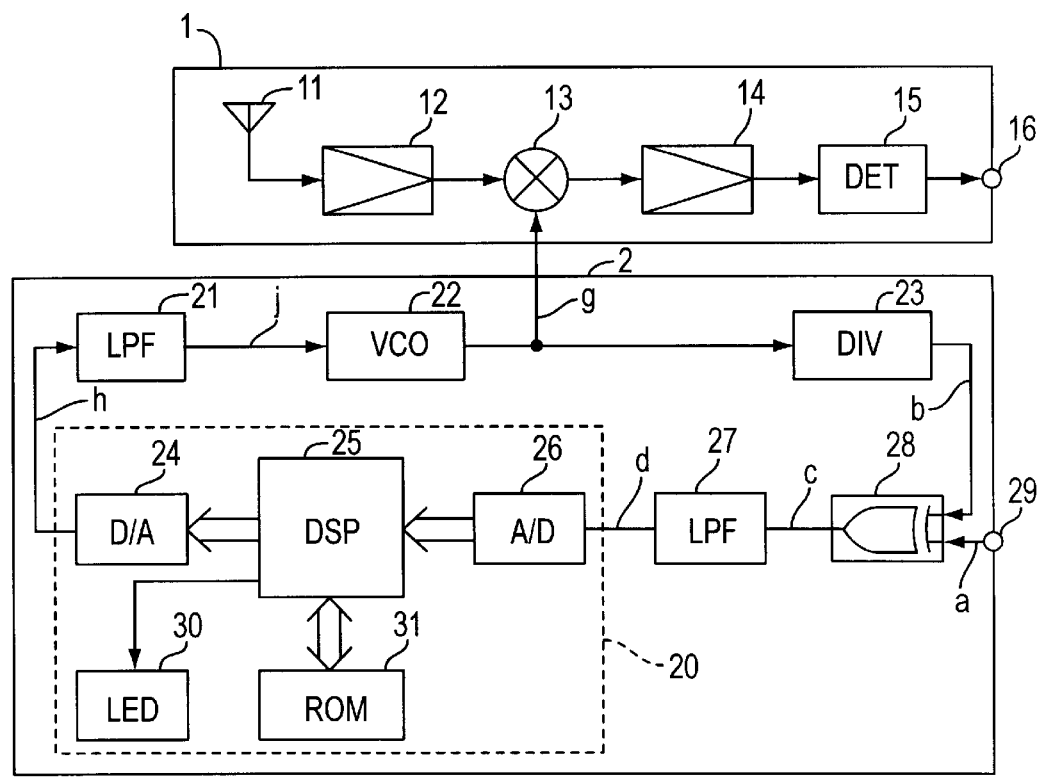
FIG. 2 is a block diagram of a radio receiver which incorporates an AFC oscillation circuit according to a first embodiment of the present invention.

FIG. 2 shows in block form a radio receiver which incorporates an AFC oscillation circuit according to a first embodiment of the present invention. As shown in FIG. 2, a high-frequency signal received by an antenna 11 is amplified by an amplifier 12, and then converted into an intermediate-frequency signal by a mixer 13. The intermediate-frequency signal is amplified by an amplifier 14. A detector 15 detects a modulation signal from the intermediate-frequency signal, and outputs the detected modulation signal as a baseband signal from an output terminal 16. The mixer 13 generates the intermediate-frequency signal by mixing the high-frequency signal and a local oscillation signal "g" supplied from a VCO 22 of an AFC oscillation circuit 2.

The VCO 22 generates a local oscillation signal "g" which has a frequency depending on an analog control voltage "j" supplied from a LPF 21. The local oscillation signal "g" is frequency-divided into a frequency-divided signal "b" at a given frequency division ratio. A phase comparator 28 detects a phase difference between the frequency-divided signal "b" and a reference signal "a" supplied from an external terminal 29, and produces a digital phase difference signal "c" representing the detected phase difference. The digital phase difference signal "c" passes through an LPF 27 and is converted thereby into a smoothed analog phase difference signal "d", which is supplied to a control circuit 20. The control circuit 20 generates a control voltage "h" for reducing the phase difference represented by the phase difference signal "d". The control voltage "h" is smoothed by an LPF 21 into a control voltage "j" that is supplied to the VCO 22.

The control circuit 20 comprises an analog-to-digital (A/D) converter 26 for converting the analog phase difference signal "d" into a digital phase difference signal, a high-speed processor like a Digital Signal Processor (DSP) 25 for processing the digital phase difference signal from the A/D converter 26 according to a predetermined algorithm to generate a digital control voltage, a digital-to-analog (D/A) converter 24 for converting the digital control voltage into an analog control voltage "h", a flash read-only memory (ROM) 31 which stores a preset first phase difference ΔP, and a light-emitting diode (LED) 30. The flash ROM 31 can store a control voltage from and read a control voltage into the high-speed processor 25, and can read the stored first phase difference ΔP into the high-speed processor 25.

Operation of the AFC oscillation circuit 2 will be described below with reference to FIGS. 2 and 3.

The operation of the AFC oscillation circuit 2 is basically similar to the operation of the conventional PLL oscillator. However, after the frequency of the local oscillation signal "g" is locked by the known PLL operation, the AFC oscillation circuit 2 is capable of controlling the frequency of the local oscillation signal "g" because of the flash ROM 31. Specifically, the phase comparator 28 generates a digital phase difference signal "c" based on a detected phase difference, and supplies the digital phase difference signal "c" to the LPF 27, which converts the digital phase difference signal "c" into an analog phase difference signal "d". The analog phase difference signal "d" is converted by the A/D converter 26 into a digital phase difference signal which is applied to the high-speed processor 25. The high-speed processor 25 monitors a change per unit time ΔT in the digital phase difference signal that has been converted from the phase difference signal "c". When the high-speed processor 25 detects the change as being smaller than the first phase difference ΔP stored in the flash ROM 31, the high-speed processor 25 determines a first control voltage H1, which is a control signal upon such detection, and uses the first control voltage H1 as a subsequent control signal for the VCO 22.

More specifically, a reference signal "a" having a reference frequency is supplied to the external terminal 29. The reference signal "a" is a signal having a stable frequency which is generated by a reference oscillator such as a quartz oscillator or the like. The reference signal "a" is supplied from the external terminal 28 to a first input terminal of the phase comparator 28. In FIG. 3, the reference signal "a" is shown as a clock signal. The frequency divider 23 frequency-divides the local oscillation signal "g" from the VCO 22 into a frequency-divided signal "b" having a frequency in the vicinity of the frequency of the reference signal "a", and supplies the frequency-divided signal "b" to a second input terminal of the phase comparator 28. The phase comparator 28, which comprises an exclusive-OR gate, detects a phase difference between the reference signal "a" and the frequency-divided signal "b", and generates a phase difference signal "c" representative of the detected phase difference. The phase difference signal "c" passes through the LPF 27 and is smoothed thereby into a phase difference signal "d" containing a DC component. The phase difference signal "d" is converted by the A/D converter 26 into a digital phase difference signal, which is supplied to the high-speed processor 25 which comprises a digital signal processor (DSP) capable of high-speed processing operation. The high-speed processor 25 is operated according to a predetermined algorithm to reduce a time-dependent change in the phase difference signal "d", and generates a digital control voltage depending on the digital phase difference signal. The control voltage from the high-speed processor 25 is converted by the D/A converter 24 into an analog control voltage "h", which is smoothed by the LPF 21 into a DC control voltage "j" that is supplied to the VCO 22. In response to the supplied control voltage "j", the VCO 22 generates an oscillation signal "g" held in phase with the reference signal "a", i.e., locked in frequency to or synchronized with the reference signal "a".

When the oscillation signal "g" generated by the VCO 22 is synchronized in frequency with the reference signal "a", i.e., locked to the reference signal "a", the phase difference signal "c" is of a substantially constant value "c01", i.e., a change in the phase difference signal "d" in a certain given time ΔT is minimum. The high-speed processor 25 always monitors such a change in the phase difference signal "d" in the given time ΔT, and compares the change with the first phase difference Δwhich is stored as a minimum value for the change in the phase difference signal "d" in the flash ROM 31. If the change in the phase difference signal "d" in the given time ΔT is equal to or smaller than the first phase difference ΔP stored in the flash ROM 31, the high-speed processor 25 decides that the synchronization of the oscillation signal "g" with the reference signal "a" is completed, and energizes the LED 30. At the same time, the high-speed processor 25 stores a control voltage "h" at the time it decides that the synchronization of the oscillation signal "g" with the reference signal "a" is completed, as a first control voltage H1 in the flash ROM 31.

Thereafter, the high-speed processor 25 disables the PLL, continuously reads the first control voltage H1 from the flash ROM 31 and supplies the first control voltage H1 to the D/A converter 24. The frequency-locked state can be confirmed by the energization of the LED 30. Even if the reference oscillator is disconnected from the external terminal 29 while the LED 30 is being energized, the AFC oscillation circuit 2 can maintain its normal operation.

Since the high-speed processor 25 disables the PLL after the frequency of the oscillation signal "g" is locked, it can produce the oscillation signal "g" stably without being affected by fluctuations which the oscillation signal "g" would otherwise suffer due to the PLL or by noise.

The control voltage "h" for the PLL is generated by digital signal processing of the high-speed processor 25, so that the control voltage "j" produced upon the frequency locking can be secured and supplied to the VCO 22 even after the frequency locking. Therefore, the reference signal "a" may be supplied to the external terminal 29 only until the first oscillation signal "g" is synchronized in frequency with the reference signal "a". As a result, it is not necessary to install, as a fixed reference oscillation source, the reference oscillator for generating the highly accurate reference signal "a". The AFC oscillation circuit 2 may be relatively small in size as it does not require the reference oscillator for generating the highly accurate reference signal "a" within itself.

An AFC oscillation circuit 2A according to a second embodiment of the present invention will be described below with reference to FIGS. 2 and 4.

In the AFC oscillation circuit 2 according to the first embodiment, when the frequency of the oscillation signal "g" is to be locked, the reference signal "a" from the external reference oscillator is inputted through the external terminal 29, and after the frequency of the oscillation signal "g" is locked, the supply of the reference signal "a" from the external reference oscillator is stopped. Therefore, the accuracy of the frequency of the oscillation signal "g" after it is locked depends on the frequency stability of the VCO 22. Consequently, there is a demand for a small and inexpensive means for stabilizing the frequency of the oscillation signal "g". According to the second embodiment, a VCO whose frequency stability may not be very high may be used to generate the oscillation signal "g" which has high frequency stability.

The AFC oscillation circuit 2A according to the second embodiment is essentially the same as the AFC oscillation circuit 2 according to the first embodiment. Parts of the AFC oscillation circuit 2A which are similar to those of the AFC oscillation circuit 2 will be described below with like reference numerals with an suffix A. As shown in FIG. 4, the AFC oscillation circuit 2A includes a pull-up voltage source +5V connected through a resistor R1 to a junction between the external terminal 29A and the phase comparator 28 and a clock stop detector 32 connected to the same junction. The clock stop detector 32 may comprise an HC123-type monostable multivibrator which is a general-purpose logic circuit, for example. The flash ROM 31A stores a first control voltage H1 which is stored when the frequency of the oscillation signal "g" is locked, a preset first phase difference ΔP, and a second phase difference ΔE. The second phase difference ΔE is established as a threshold for a shift of the phase difference signal "d" from a phase difference signal "d-02" (P1) at the time the reference signal "a" is stopped.

The voltage of +5V is applied through the resistor R1 to the first input terminal of the phase comparator 28A which is connected to the external terminal 29A. When the reference signal "a" is supplied to the external terminal 29A, the level at the first input terminal of the phase comparator 28A varies in the same manner as with the first embodiment. However, when the supply of the reference signal "a" is stopped, the level at the first input terminal of the phase comparator 28A is kept at "1" as indicated by a reference signal "a02" in FIG. 5. The clock stop detector 32 has an output terminal connected to the high-speed processor 25A. While the reference signal "a" is being supplied, the clock stop detector 32 outputs a level "1" to the high-speed processor 25A.

When the level at the first input terminal of the phase comparator 28A is kept at "1", the clock stop detector 32 outputs a level "0" to the high-speed processor 25A.

The AFC oscillation circuit 2A according to the second embodiment operates as follows:

First, as with the first embodiment, the reference signal "a" is supplied to the external terminal 29A to bring the frequency of the oscillation signal "g" from the VCO 22A into synchronism with the frequency of the reference signal "a". After the frequency of the oscillation signal "g" is locked, the first control voltage H1 stored in the flash ROM 31A is read and outputted to the D/A converter 24A. Therefore, the frequency of the oscillation signal "g" outputted from the VCO 22A is controlled by the control signal "j" which corresponds to the first control voltage H1. When a phase difference of the phase difference signal "d" in the time ΔT becomes equal to or smaller than the first phase difference ΔP and the frequency of the oscillation signal "g" is locked, the LED 30A is energized.

When the frequency locking is confirmed based on the energization of the LED 30A and the supply of the reference signal "a" is stopped, the output signal from the clock stop detector 32 has a level "0", indicating to the high-speed processor 25A that the reference oscillator is disconnected from the external terminal 29A and the supply of the reference signal "a" to the external terminal 29A is stopped. When the supply of the reference signal "a" is stopped after the frequency of the oscillation signal "g" is locked, the high-speed processor 25A continues to output the first control signal H1 to the D/A converter 24A.

At this time, as shown in FIG. 5, the frequency-divided signal "b" becomes a frequency-divided signal "b0" in synchronism with the reference signal "a", and the reference signal "a" inputted to the phase comparator 32A becomes a reference signal "a0" placed at the level of +5V. Therefore, the phase difference signal "c" becomes a phase difference signal "c0" which has the same waveform as the frequency-divided signal "b0". The LPF 27A thus outputs a phase difference signal "d02" corresponding to the phase difference signal "c0" to the A/D converter 26A. The phase difference signal "d02" inputted to the A/D converter 26A is converted thereby into a digital phase difference signal, which is supplied to the high-speed processor 25A. The high-speed processor 25A stores a value D of the digital phase difference signal as a first phase difference signal P1 into the flash ROM 31A.

Thereafter, the high-speed processor 25A always monitors the digital phase difference signal "d" inputted to the A/D converter 26A, and compares the phase difference signal "d" with the first phase difference signal P1 stored in the flash ROM 31A. If a differential value (d–P1) between the compared signals exceeds the second phase difference ΔE stored in the flash ROM 31A, then the high-speed processor 25A decides that the frequency of the oscillation signal "g" from the VCO 22A is shifted, and resumes a PLL operation. Specifically, if (d–P1)>ΔE, then the high-speed processor 25A changes the first control voltage H1 to be outputted as the control voltage "h" to the D/A converter 24A so as to reduce the differential value (d–P1) for thereby controlling the frequency of the oscillation signal "g". If the monitored digital phase difference signal "d" outputted from the A/D converter 26A becomes equal to the first phase difference signal P1, then the high-speed processor 25A updates the first control voltage H1 stored in the flash ROM 31A with a control voltage at this time. Thereafter, the high-speed processor 25A disables the PLL, and continuously outputs the updated first control voltage H1 to the D/A converter 24A.

As described above, the AFC oscillation circuit according to the present invention can produce a stable oscillation signal "g" without a built-in reference oscillator. However, the AFC oscillation circuit may have a built-in reference oscillator. The AFC oscillation circuit with a built-in reference oscillator operates as follows: After the frequency of the oscillation signal "g" is locked, the phase difference signal P1 is stored in the flush ROM 31A, and the PLL is disabled. Thereafter, when a shift of the frequency of the oscillation signal "g", i.e., a shift of the phase difference signal "d" from the first phase difference signal P1, is detected as described above, the high-speed processor 25A resumes operation of the PLL to synchronize the frequency of the oscillation signal "g" with the frequency of the reference signal "a".

Although preferred embodiments of the present invention have been described using specific terms, such description is for illustrative purposes only, and it is to be understood that changes and variations may be made therein without departing from the spirit or scope of the following claims.

What is claimed is:

1. An automatic frequency control oscillation circuit, comprising:

a voltage-controlled oscillator for producing an oscillation signal whose frequency is controlled by a primary control voltage said primary control voltage being derived from a secondary control voltage;

a phase comparator for detecting a phase difference between a frequency-divided signal derived from the oscillation signal and a reference signal thereby generating a phase difference signal; and a control circuit for generating a secondary control voltage to reduce a time-dependent change in the phase difference signal and synchronize the oscillation signal with the reference signal;

said control circuit comprising:

means for monitoring and comparing time-dependent change in the phase difference signal with a predetermined initial phase difference; and means for determining said secondary control voltage when the time-dependent change in the phase difference signal is detected to be equal to or smaller than said predetermined initial phase difference.

2. An automatic frequency control oscillation circuit according to claim 1, wherein said control circuit has analog-to-digital converting means for converting the phase difference signal from an analog form into a digital phase difference signal, a high-speed processor for generating a digital control voltage in response to the digital phase difference signal, and digital-to-analog converting means for converting the digital control voltage into an analog control voltage.

3. An automatic frequency control oscillation circuit, comprising:

a voltage-controlled oscillator for producing an oscillation signal whose frequency is controlled by a primary control voltage, said primary control voltage being derived from a secondary control voltage;

a phase comparator for detecting a phase difference between a frequency-divided signal derived from the oscillation signal, and a reference signal thereby generating a phase difference signal; and a control circuit for generating a secondary control voltage to reduce a time-dependent change in the phase difference signal and synchronize the oscillation signal with the reference signal;

said control circuit comprising:

means for monitoring and comparing time-dependent change in the phase difference signal with a predetermined initial phase difference; and means for determining said secondary control voltage when the time-dependent change in the phase difference signal is detected to be equal to or smaller than said predetermined initial phase difference;

analog-to-digital converter for converting the phase difference signal from an analog form into a digital phase difference signal;

a high-speed processor for generating a digital control voltage in response to the digital phase difference signal; and digital-to-analog converter for converting the digital control voltage into an analog control voltage;

a flash read-only memory for storing a digital first control voltage and said predetermined initial phase difference, wherein said high-speed processor comprises means for storing a stored control value from said flash read-only memory when the time-dependent change in the phase difference signal is detected for the first time to be equal to or smaller than said predetermined initial phase difference, and thereafter reading the stored control value into said digital-to-analog converter.

4. An automatic frequency control oscillation circuit according to claim 3, further comprising a reference signal stop detector for monitoring the reference signal and supplying an interrupt signal indicative of an interruption of the reference signal to said highspeed processor when a stop of supply of the reference signal is detected, wherein said flash read-only memory stores a predetermined second phase difference, and said high-speed processor establishes said digital control voltage from said digital first control voltage stored in said flash read-only memory, thereafter updating said digital phase difference signal stored in said flash read-only memory with said phase difference signal in response to the signal indicative of an interruption of the reference signal, comparing the updated digital phase difference signal with the phase difference signal outputted from said analog-to digital converter, and if the difference between the updated digital phase difference signal and the phase difference signal outputted from said analog-to digital converter is equal to or greater than said second phase difference, updating the digital first control voltage stored in said flash read-only memory.

5. An automatic frequency control oscillation circuit according to claim 4, wherein said phase comparator comprises an exclusive-OR gate having a first input terminal for being supplied with said reference signal, said first input terminal being connected to a pull-up voltage source, and a second input terminal for being supplied with said frequency divided signal.

6. An automatic frequency control oscillation circuit, comprising:

a voltage-controlled oscillator for producing an oscillation signal whose frequency is controlled by a primary control voltage;

a phase comparator for detecting a phase difference between a frequency-divided signal derived from said oscillation signal and a reference signal thereby generating a phase difference signal; and a control circuit for generating a secondary control voltage to reduce a time-varying phase difference signal and synchronize said oscillation signal with the reference signal;

said control circuit comprising:

means for storing a predetermined initial phase difference;

means for monitoring and comparing said time-varying phase difference signal with said predetermined initial phase difference;

means for determining said secondary control voltage when the time-varying phase difference signal is detected to be equal to or smaller than said initial phase difference; and means for deriving said primary control voltage from said secondary control voltage and delivering said primary control voltage to said voltage-controlled oscillator.

7. An automatic frequency control oscillation circuit according to claim 6, wherein said control circuit further comprises;

an analog-to-digital converter for converting the phase difference signal from an analog form into a digital phase difference signal;

a high-speed processor for generating a digital control voltage in response to the digital phase difference signal; and a digital-to-analog converter for converting the digital control voltage into an analog control voltage.

8. An automatic frequency control oscillation circuit according to claim 7, wherein said storing means comprises a flash read-only memory for storing a digital secondary control voltage and a predetermined phase difference, wherein said high-speed processor comprises means for storing said digital secondary control voltage when the time-varying phase difference signal is detected for the first time to be equal to or smaller than said initial phase difference, and reading the stored secondary control voltage into said digital-to-analog converter.

9. A method of controlling an oscillation signal of an automatic frequency control oscillation circuit having a voltage-controlled oscillator for producing an oscillation signal whose frequency is controlled by a primary control voltage, a phase comparator for detecting a phase difference between a frequency-divided signal derived from the oscillation signal and a reference signal thereby generating a phase difference signal, and a control circuit for generating a secondary control voltage to reduce a time-dependent change in the phase difference signal to synchronize the oscillation signal with the reference signal, said method comprising the steps of:

establishing an initial phase difference as a threshold for the time-dependent change in the phase difference signal;

comparing the time-dependent change in the phase difference signal with said initial phase difference;

determining said secondary control voltage when the time-dependent change in the phase difference signal is detected to be equal to or smaller than said initial phase difference; and establishing said primary control voltage from said secondary control voltage.

* * * * *

UNITED STATES PATENT AND TRADEMARK OFFICE
CERTIFICATE OF CORRECTION

PATENT NO. : 5,818,302
DATED : October 6, 1998
INVENTOR(S) : Shigeru OTSUKA and Kanada NAKAYASU It is certified that error appears in the above-identified patent and that said Letters Patent is hereby corrected as shown below:

Column 6, line 24, delete "Δ which" and insert --ΔP which--.

Column 8, line 55, delete "flush" and insert --flash--.

Column 10, line 10, delete "highspeed" and insert --high-speed--.

Signed and Sealed this

First Day of June, 1999

Attest:

Q. TODD DICKINSON

Attesting Officer

Acting Commissioner of Patents and Trademarks